United States Patent [19]

Thompson

[11] Patent Number: 4,814,836
[45] Date of Patent: Mar. 21, 1989

[54] FET PHOTOCONDUCTOR WITH A HETEROJUNCTION IN THE CHANNEL

[75] Inventor: George H. B. Thompson, Sawbridgeworth, United Kingdom

[73] Assignee: ITT Gallium Arsenide Technology Center A Division of ITT Corporation, Roanoke, Va.

[21] Appl. No.: 842,104

[22] Filed: Mar. 20, 1986

[30] Foreign Application Priority Data

Mar. 21, 1985 [GB] United Kingdom ............... 8507343

[51] Int. Cl.[4] ............ H01L 29/80; H01L 29/161; H01L 27/14
[52] U.S. Cl. ........................ 357/22; 357/16; 357/30; 357/61; 357/63
[58] Field of Search ............ 357/30 I, 30 B, 30 E, 357/22 B, 22 A, 16, 22 MD, 61, 63

[56] References Cited

U.S. PATENT DOCUMENTS

| 4,213,138 | 7/1980 | Campbell et al. | 357/16 |
| 4,323,911 | 4/1982 | Campbell et al. | 357/30 E |
| 4,424,525 | 1/1984 | Mimura | 357/22 A |
| 4,499,481 | 2/1985 | Greene | 357/22 A |
| 4,636,829 | 1/1987 | Greenwood et al. | 357/30 D |
| 4,734,750 | 3/1988 | Okamura et al. | 357/16 |

FOREIGN PATENT DOCUMENTS

| 0055968 | 7/1982 | European Pat. Off. | 357/22 MD |
| 0160377 | 11/1985 | European Pat. Off. | 357/30 E |
| 58-93380 | 6/1983 | Japan | 357/22 MD |
| 59-5675 | 1/1984 | Japan | 357/22 MD |

OTHER PUBLICATIONS

Ohno et al., "Double Heterostructure $Ga_{0.47}In_{0.53}As$ MESFETs by MBE", IEEE Electron Device Letters, vol. Edl-1, No., Aug. 1980.

Fowler et al., "Inverted Thin-Film Transistor", IBM Technical Disclosure Bulletin, vol. 11, No. 9, Feb. 1969.

Primary Examiner—J. Carroll
Assistant Examiner—Ngan Van Ngo
Attorney, Agent, or Firm—Robert A. Walsh; Thomas N. Twomey; Mary C. Werner

[57] ABSTRACT

A photoconductor comprising an optically sensitive FET in which an abrupt heterojunction (18) is inserted in the channel (11) at a certain distance from the gate contact (16). This provides a potential barrier (17, FIG. 4) in the valence band that accumulates minority carriers (carriers of the lower mobility type) and controls their release. A gate bias resistor which is conventionally used in a receiver circuit including the FET is no longer required, instead the potential barrier height determines the time constant and a response comparable in length with an input optical pulse is achieved. This overcomes the problems of integrated manufacture, and slow response, associated with the large value of the bias resistor which is needed to reduce noise.

5 Claims, 3 Drawing Sheets

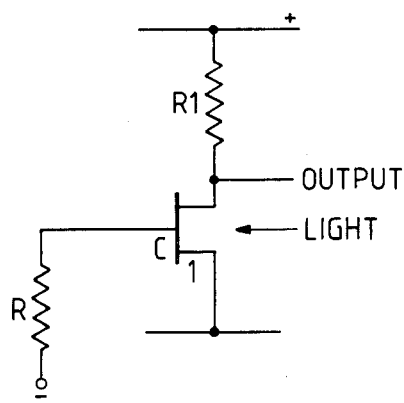
Fig.1a.
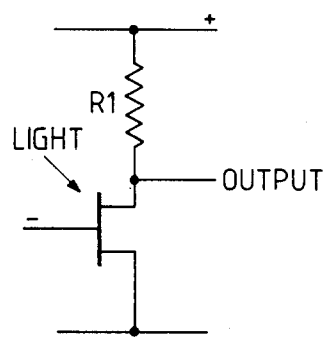
Fig.2a.
Fig.1b.
Fig.1c.
Fig.2b.
Fig.3.
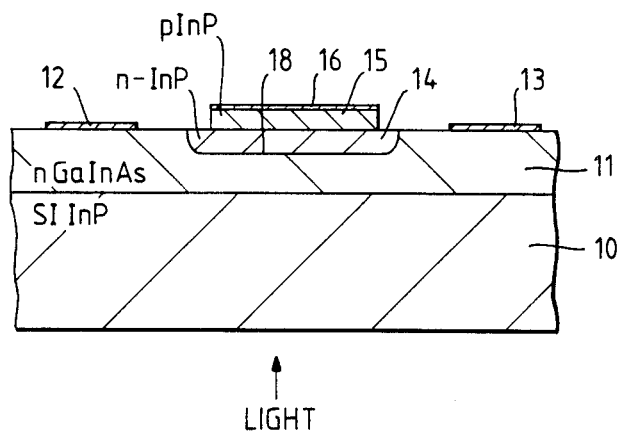

FET PHOTOCONDUCTOR WITH A HETEROJUNCTION IN THE CHANNEL

This invention relates to photoconductors and in particular to optically sensitive field effect transistors (FET).

According to the present invention there is provided a photoconductor including a channel region in which electron-hole pairs are created in response to the incidence of optical radiation thereat, a gate associated with the channel region and an abrupt heterojunction in the channel region which serves to cause the accumulation of carriers of the lower mobility type and to control their release.

Embodiments of the present invention will now be described with reference to the accompanying drawings, in which:

FIG. 1a illustrates the conventional receiver circuit for an optically sensitive FET, FIG. 1b illustrates an input optical pulse and FIG. 1c illustrates the corresponding response of the FET;

FIG. 2a illustrates the receiver circuit for an optically sensitive FET according to the present invention, and FIG. 2b illustrates its response to an input optical pulse as illustrated in FIG. 1b;

FIG. 3 illustrates a cross-section through one embodiment of optically sensitive FET according to the present invention;

A conventional compound semiconductor junction FET (JFET) may be used as an optically sensitive FET (photoFET). Such a photoFET comprises a semi-insulating substrate upon which is a relatively high conductivity channel layer. Source, drain and gate contacts are made to the channel layer from the same surface thereof. This photoFET may be employed to detect light incident on the said surface or light incident on the substrate from underneath. The receiver circuit for sch a photoFET 1 is shown in FIG. 1a. A gate bias resistor R is needed and this is required to be of a large value (typically 1 Mohm) in order to reduce the receiver noise. Such a high value resistance as well as being difficult to manufacture in integrated form with the photoFET introduces complications of slow response. An input optical pulse of the shape indicated in FIG. 1b produces a response (output of the photoFET receiver) as in FIG. 1c which has a greatly increased length in comparison with the input pulse due to the high value of the time constant ($\tau$) of the receiver circuit resulting from the high value of R. $\tau = RC$ where C is the capacitance of the photoFET 1. That is the photoFET has a slow response.

It is thus desirable to be able to reduce the value of the time constant $\tau$ to such a value whereby CR approximates more closely to the input pulse length and thus to increase the speed of response. However this should be achieved in such a manner that the receiver noise is maintained at a similar level to when a high value gate bias resistor is employed.

We have found that this can be achieved by omitting the gate bias resistor in the receiver circuit and modifying the photoFET structure by inserting an abrupt heterojunction in the channel layer at a certain distance from the gate contact. The receiver circuit is then as illustrated in FIG. 2a.

Figure 4:
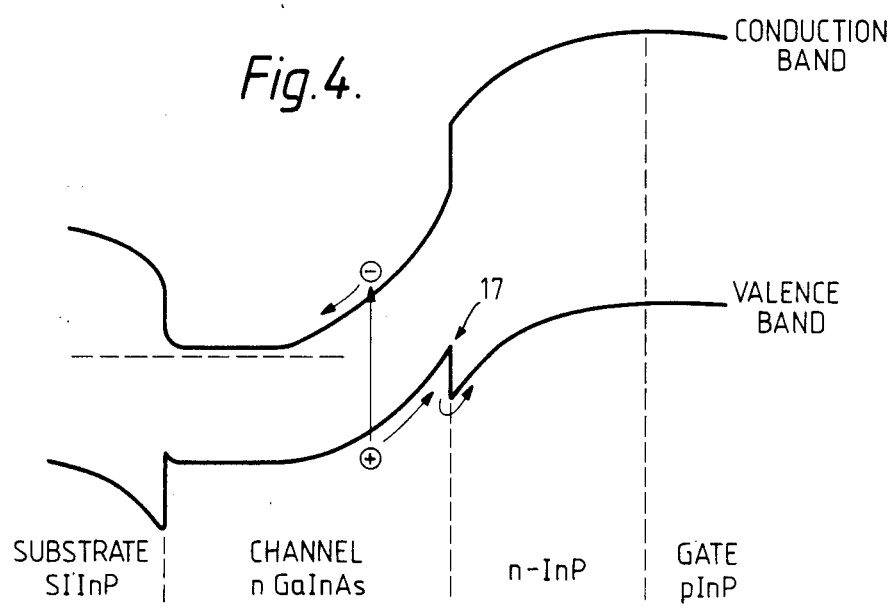
FIG. 4 illustrates the band structure of the embodiment of FIG. 3.

FIG. 3 illustrates one embodiment of such a modified photoFET. The device is based on a conventional photosensitive JFET having a semi-insulating InP substrate 10, an n GaInAs channel layer 11 and source and drain contacts 12 and 13 respectively. In a portion of the channel layer 11 is disposed an $n^-$ InP region 14, in contact with which is a p InP region 15 on which a gate contact 16 is disposed, the region 15 providing the required p gate of a JFET. The device of FIG. 3 is thus a JFET modified by the addition of $n^-$ InP region 14. The device is illuminated from below as indicated and has the band structure illustrated in FIG. 4. When light is incident on the channel layer 11 photon-induced electron-hole pairs are created. In a normal photoFET the electrons of the pairs are driven away from the gate contact into the non-depleted part of the channel and then drift towards the contact and the holes of the pairs are driven towards the gate contact. Due to the presence of the $n^-$ InP region 14 there is an abrupt heterojunction 18 and a potential barrier 17 (FIG. 4), in the valence band which causes the accumulation of holes (minority carriers; carriers of the lower mobility by pe), that is it traps holes, and controls their release to the gate. The height of this potential barrier 17 and the volume in which the holes are trapped thus determines the time constant. The time constant thus depends on the composition step and is adjustable with the applied field to obtain a required value. The response in one such case is as indicated in FIG. 2b, where the time constant is substantially equal to the pulse length of FIG. 1a. With such a potential barrier arrangement it is considered that the added noise should be no greater than the shot noise of the detected current. For optimum behaviour the thickness of layer 14 should be greater than the thickness of layer 11 beneath it.

Figure 5:
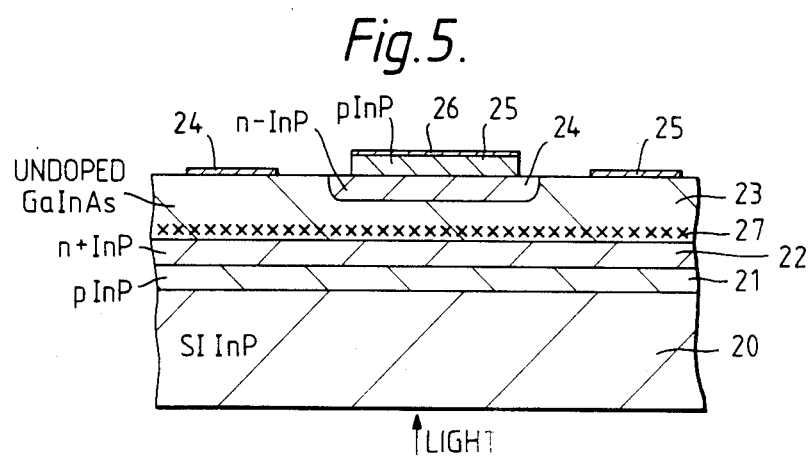
FIG. 5 illustrates a cross-section through another embodiment of optically sensitive FET according to the present invention.

FIG. 5 illustrates an inverted HEMT (high electron mobility transistor) photoFET which has been modified in a similar manner to FIG. 3 to provide a potential barrier to accumulate minority carriers and control their release. The device of FIG. 5 includes a semi-insulating InP substrate 20, upon which light is incident as shown, on which is disposed a p InP layer 21, an $n^+$ InP layer 22 being disposed on layer 21 and a substantially undoped GaInAs layer 23 being disposed on the layer 22. Source and drain contacts 28 and 29 are provided to the layer 23. In a portion of layer 23 is provided an $n^-$ InP region 24, which determines the potential barrier for minority carriers, and a p-type gate is provided by virtue of a p InP region 25 and a gate contact 26. In such an HEMT device mobility is improved by virtue of the two-dimensional electron gate 27 produced in a region of layer 23 adjacent layer 22. For optimum behaviour the thickness of the layer 24 should be greater than the thickness of layer 23 beneath it.

Figure 6:
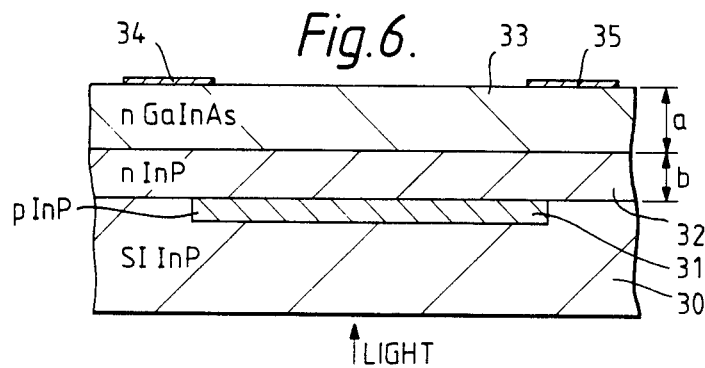
FIG. 6 illustrates a cross-section through a further embodiment of optically sensitive FET according to the present invention.
Figure 7:
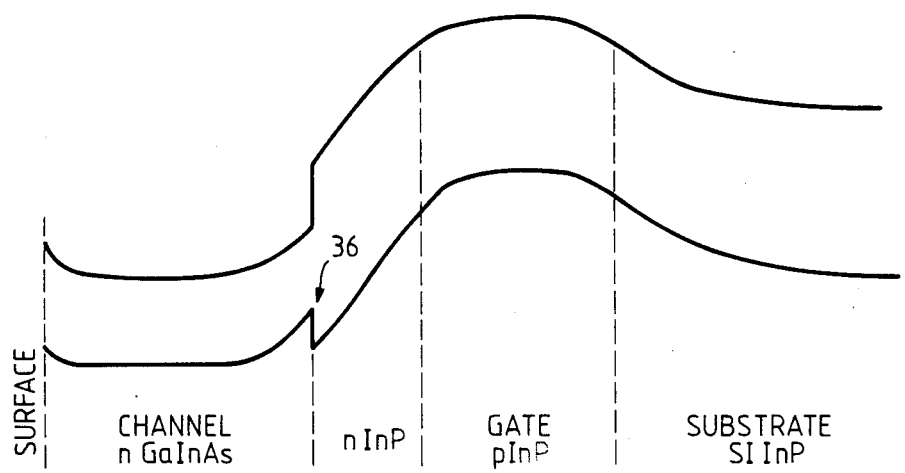
FIG. 7 illustrates the band structure of the embodiment of FIG. 6.

FIG. 6 illustrates an embedded gate photoFET which has been modified to provide a potential barrier to accumulate minority carriers and control their release. The device of FIG. 6 includes a semi-insulating substrate 30 in a surface of which is embedded a p Inp gate 31, on the surface and gate 31 is disposed on an InP layer 32, providing said potential barrier, on the layer 32 is disposed an n GaInAs channel layer 33, source and drain contacts 34 and 35 are applied to the layer 33. There is also a contact (not shown) to the p InP gate 31. Light is incident on the substrate 30 as shown. FIG. 7 illustrates the band structure of the embedded gate photoFET of FIG. 6. The potential barrier which serves to accumulate minority carriers and control their release is indicated at 36. For optimum behaviour the thickness (b) of layer 32 should be greater than the thickness (a) of layer 33, although FIGS. 6 and 7 are not drawn to show this relationship. To increase the photosensitive area of this FET the source and drain contacts can be interdigitated so that except at the edge each contact is flanked by a pair of contacts of the opposite type.

Figure 8:
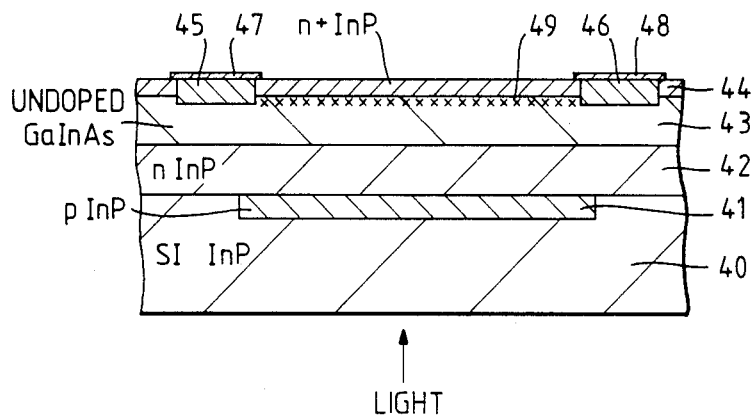
FIG. 8 illustrates a cross-section through yet another embodiment of optically sensitive FET according to the present invention.

FIG. 8 illustrates an embedded gate photoHEMT which has been modified to provide the potential barrier. The device of FIG. 8 comprises a semi-insulating InP substrate 40 in a surface of which is embedded a pInP gate 41, on the surface and the gate 41 is disposed an n InP layer 42, providing said potential barrier, on the layer 42 is a substantially undoped GaInAs layer 43 and on layer 43 is an n+ InP layer 44, there are also alloyed or implanted source and regions 45 and 46 and source and drain contacts 47 and 48. There is also a contact (not shown) to the pInP gate 41. Light is incident on the substrate 40 as shown and a two-dimensional electron gas 49 produced in layer 43 adjacent to layer 44 improves mobility. The source and drain contacts can also be interdigitated on this structure to increase the photosensitive area.

Whereas the invention has been described with reference to devices comprised of GaInAs and InP it is not to be considered as so limited. Any compound semiconductor sensitive to the radiation of interest may be substituted for GaInAs, and a compound semiconductor of equal lattice constant to said substituted compound semiconductor but with a broader band gap and the necessary step in the valence band relative to said substituted compound semiconductor to cause the minority carrier accumulation may be substituted for InP.

I claim:

1. A photoconductor including a channel region of a first semiconductor material having a first conductivity type in which electron-hole pairs are created in response to the incidence of optical radiation thereat, a gate of a second conductivity type associated with and forming a p-n junction with the channel region and a region of a second semiconductor material forming an abrupt heterojunction in the channel region separated from said p-n junction which serves to cause the accumulation of carriers of the lower mobility type and to control their release to said gate in response to the potential applied to said gate;

said photoconductor including two electrical contacts to the channel region, one of which is biased more positively than the other, the gate being associated with the channel region between the two contacts; and said photoconductor being in the form of an inverted HEMT photoFET comprising a substrate of semi-insulating InP, a layer of p InP on a surface of the substrate, a layer of n+ on the p InP layer, a substantially undoped layer of GaInAs on the n+ InP layer and partially comprising said channel region, the two electrical contacts being spaced apart on a surface of the GaInAs layer, a region of n− InP also comprising the channel region and extending into the GaInAs layer from the surface thereof between the two contacts, and the gate comprising a p InP region in contact with the n− InP region.

2. A photoconductor including a channel region of a first semiconductor material having a first conductivity type in which electron-hole pairs are created in response to the incidence of optical radiation thereat, a gate of a second conductivity type associated with and forming a p-n junction with the channel region and a region of a second semiconductor material forming an abrupt heterojunction in the channel region separated from said p-n junction which serves to cause the accumulation of carriers of the lower mobility type and to control their release to said gate in response to the potential applied to said gate;

said photoconductor including two electrical contacts to the channel region, one of which is biased more positively than the other, the gate being associated with the channel region between the two contacts; and said photoconductor being in the form of an embedded gate photoFET comprising a substrate of semi-insulating InP into a surface of which extends a p InP region comprising said gate, a layer of n InP disposed on said surface and over and in contact with the p InP region an n GaInAs layer disposed on the n InP layer, the n GaInAs and n InP layers together comprising the channel region the two electrical contacts being spaced apart on a surface of the n GaInAs layer.

3. A photoconductor including a channel region of a first semiconductor material having a first conductivity type in which electron-hole pairs are created in response to the incidence of optical radiation thereat, a gate of a second conductivity type associated with and forming a p-n junction with the channel region and a region of a second semiconductor material forming an abrupt heterojunction in the channel region separated from said p-n junction which serves to cause the accumulation of carriers of the lower mobility type and to control their release to said gate in response to the potential applied to said gate;

said photoconductor including two electrical contacts to the channel region, one of which is biased more positively than the other, the gate being associated with the channel region between the two contacts; and said photoconductor being in the form of an embedded gate photoHEMT comprising a substrate of semi-insulating InP into a surface of which extends a p InP region comprising said gate, a layer of n InP disposed on said surface and over and in contact with the p InP region, a substantially undoped GaInAs layer on the n InP layer, the GaInAs and n InP layers together comprising the channel region, an n+ InP layer disposed on the GaInAs layer, the two electrical contacts being spaced apart on a surface of the n+ InP layer and connected to the GaInAs layer via alloyed or implanted regions extending through the n+ InP layer.

4. A photoconductor as claimed in claim 2, wherein the two electrical contacts are interdigitated whereby to obtain a large photosensitive area without increasing the distance between the contacts.

5. A photoconductor including a channel region of a first semiconductor material having a first conductivity type in which electron-hole pairs are created in response to the incidence of optical radiation thereat, a gate of a second conductivity type associated with and forming a p-n junction with the channel region and a region of a second semiconductor material forming an abrupt heterojunction in the channel region separated from said p-n junction which serves to cause the accumulation of carriers of the lower mobility type and to control their release to said gate in response to the potential applied to said gate;

said photoconductor including two electrical contacts to the channel region, one of which is biased more positively than the other, the gate being associated with the channel region between the two contacts; and said photoconductor being in the form of a photo-FET comprising a substrate of semi-insulating InP, the channel region including a layer of n GaInAs disposed on one surface of the substrate, the two electrical contacts being spaced apart on a surafce of the n GaInAs layer, and the channel region further including a region of $n^-$ InP extending into the n GaInAs layer from the surface thereof between the two contacts, and the gate comprising a p InP region in contact the $n^-$ InP region;

wherein the GaInAs is substituted by a compound semiconductor sensitive to radiation of interest and wherein the InP is substituted by a compound of equal lattice constant to said compound semiconductor but with a broader band gap and the necessary step in the valence band relative to said compound semiconductor to cause said accumulation.

* * * * *